(12) United States Patent
Lin et al.

(10) Patent No.: US 11,472,590 B2
(45) Date of Patent: Oct. 18, 2022

(54) CONTAINERS AND METHODS FOR IMPROVED MECHANICAL STRENGTH

(71) Applicant: The Coca-Cola Company, Atlanta, GA (US)

(72) Inventors: Yuping Lin, Tucker, GA (US); Robert Scott, Douglasville, GA (US)

(73) Assignee: The Coca-Cola Company, Atlanta, GA (US)

( * ) Notice: Subject to any disclaimer, the term of this patent is extended or adjusted under 35 U.S.C. 154(b) by 0 days.

(21) Appl. No.: 16/099,127

(22) PCT Filed: May 5, 2017

(86) PCT No.: PCT/US2017/031272
§ 371 (c)(1),
(2) Date: Nov. 5, 2018

(87) PCT Pub. No.: WO2017/192975
PCT Pub. Date: Nov. 9, 2017

(65) Prior Publication Data
US 2019/0389615 A1 Dec. 26, 2019

Related U.S. Application Data

(60) Provisional application No. 62/332,057, filed on May 5, 2016.

(51) Int. Cl.
*B65D 1/02* (2006.01)
*B65D 23/08* (2006.01)
(Continued)

(52) U.S. Cl.
CPC ....... *B65D 1/0215* (2013.01); *B65D 23/0814* (2013.01); *C03C 17/005* (2013.01);
(Continued)

(58) Field of Classification Search
CPC .............. B65D 1/0215; B65D 23/0814; C03C 17/005; C03C 17/22; C03C 2217/28;
(Continued)

(56) References Cited

U.S. PATENT DOCUMENTS

| | | | | |
|---|---|---|---|---|
| 6,919,114 B1 * | 7/2005 | Darras | ..................... | B05D 1/62 |
| | | | | 428/36.7 |
| 2003/0087030 A1 | 5/2003 | Hana et al. | | |

(Continued)

FOREIGN PATENT DOCUMENTS

JP      2007-016300      1/2007

OTHER PUBLICATIONS

ISA/KR (Korean Intellectual Property Office), International Search Report and Written Opinion of the International Searching Authority, dated Aug. 4, 2017, Seo-gu, Daejeon, Republic of Korea.

*Primary Examiner* — J. Gregory Pickett
*Assistant Examiner* — Niki M Eloshway
(74) *Attorney, Agent, or Firm* — Eversheds Sutherland (US) LLP (57) ABSTRACT

Containers are provided that include a body structure having a top end that defines an opening, a sealed base end, and a sidewall structure extending between the top and base ends, in which the sidewall structure has an interior surface and an exterior surface, the interior surface defining an interior space, and a protective coating that includes a diamond-like carbon on at least a portion of the exterior surface of the sidewall structure. Methods for enhancing the mechanical strength of containers are also provided.

15 Claims, 4 Drawing Sheets

(51) Int. Cl.
*C03C 17/22* (2006.01)
*C23C 14/06* (2006.01)
*C03C 17/00* (2006.01)
*C23C 14/22* (2006.01)

(52) U.S. Cl.
CPC .......... *C03C 17/22* (2013.01); *C23C 14/0605* (2013.01); *C23C 14/221* (2013.01); *C03C 2217/28* (2013.01); *C03C 2217/78* (2013.01); *C03C 2218/15* (2013.01)

(58) Field of Classification Search
CPC ............ C03C 2217/78; C03C 2218/15; C23C 14/0605; C23C 14/221
USPC .......................................................... 215/2.2
See application file for complete search history.

(56) References Cited

U.S. PATENT DOCUMENTS

| | | | |
|---|---|---|---|
| 2005/0171846 A1* | 8/2005 | Moroo | G06Q 30/0242 705/14.41 |
| 2006/0051539 A1 | 3/2006 | Yamasaki et al. | |
| 2008/0014466 A1 | 1/2008 | Wei et al. | |
| 2008/0145651 A1* | 6/2008 | Rius | C23C 16/045 428/336 |
| 2010/0165276 A1* | 7/2010 | David | B05D 3/107 349/122 |
| 2010/0264110 A1* | 10/2010 | Sumimiya | B65D 41/045 215/329 |
| 2011/0151141 A1* | 6/2011 | Upadhyaya | C23C 16/503 427/578 |
| 2012/0045592 A1 | 2/2012 | Kumar et al. | |
| 2014/0008214 A1 | 1/2014 | Chen et al. | |
| 2014/0151321 A1* | 6/2014 | Chang | B65D 23/0814 215/12.2 |

* cited by examiner

CONTAINERS AND METHODS FOR IMPROVED MECHANICAL STRENGTH

CROSS REFERENCE TO RELATED APPLICATIONS

This application claims the benefit of priority to U.S. Provisional Patent Application No. 62/332,057, filed May 5, 2016, which is hereby incorporated herein by reference in its entirety.

TECHNICAL FIELD

This disclosure relates to containers having improved mechanical strength, and methods for improving mechanical strength.

BACKGROUND

For beverage containers, one of the primary selling points is optical clarity. Historically, glass has been used as the preferred material for beverage containers because of its optical clarity and excellent chemical durability relative to other materials. It is commonly known that glass containers may be cleaned, refilled, and resold after their initial use. Refillable containers reduce waste and often are more cost-effective for manufacturers.

Soda lime glass is commonly used for glass beverage containers. However, even though the inherent chemical stability of its silica backbone enables glass to withstand most types of environmental exposure indefinitely without bulk failure, long term exposure to a variety of natural elements induces the gradual degradation of its clear appearance (optical clarity). For example, roughening of the glass surface can occur through prolonged contact with static water through ion exchange reactions that result in the leach of $Na_2O$ from the surface.

Moreover, the practical strength of most glass containers is consistently less than theoretical glass strength, which most likely arises because of the brittle nature of glass. As a result, any surface flaws, such as surface scratches, create concentrated stress sites which can propagate into major failures in the glass under certain conditions. These surface flaws can be created by at least the following: (1) the manufacturing process, (2) mechanical force, and (3) chemical attacks (condensation and caustic wash). Consequently, aggressive caustic washes of reusable glass containers with alkali solutions, combined with mechanical abrasions along filling lines (and refilling lines) and during transportation, lead to readily visible cosmetic defects such as surface scuffing and scratching. These defects, in turn, make such containers aesthetically undesirable and ultimately render them unusable.

As an alternative to glass containers, polyesters and particularly polyethylene terephthalate (PET) containers have been used for packaging beverages such as carbonated soft drinks (CSD) for many years. Refillable PET bottles represent a growing aspect of renewable and sustainable packaging applications. Refillable PET bottles often can be reused for 20 or more refilling cycles before neck and base cracking necessitates removing the bottle from circulation and routing it to a recycling processor. Neck and base cracking generally derives from caustic stress cracking that etches and damages the bottle, resulting from the high temperature caustic (aqueous base) washing process used for sterilization.

Therefore, there is a continuing need for improved containers, particularly improved reusable beverage containers. The containers will desirably have greater mechanical strength, thereby minimizing the containers' susceptibility to surface flaws during processing for reuse. Consequently, containers with greater mechanical strength would likely increase bottle cycle times (packaging life cycle) and decrease adverse environmental impacts associated with beverage packaging. New methods for increasing mechanical strength of containers are also desirable.

SUMMARY

This disclosure provides new containers having improved mechanical strength and further provides methods for improving mechanical strength of containers.

According to one aspect, for example, this disclosure provides a glass container comprising:
  a body structure having a top end that defines an opening, a sealed base end, and a sidewall structure extending between the top and base ends, wherein the sidewall structure has an interior surface and an exterior surface, the interior surface defining an interior space; and
  a protective coating on at least a portion of the exterior surface of the sidewall structure, the protective coating comprising diamond-like carbon,
  wherein the glass container is substantially clear.

In a further aspect, for example, this disclosure provides a method for enhancing the mechanical strength of a glass container, the method comprising:
  providing a body structure having a top end that defines an opening, a sealed base end, and a sidewall structure extending between the top and base ends, wherein the sidewall structure has an interior surface and an exterior surface, the interior surface defining an interior space; and
  depositing a protective coating on at least a portion of the exterior surface of the sidewall structure, the protective coating comprising diamond-like carbon,
  wherein the glass container is substantially clear.

In yet a further aspect, for example, this disclosure provides a polyethylene terephthalate (PET) container comprising:
  a body structure having a top end that defines an opening, a sealed base end, and a sidewall structure extending between the top and base ends, wherein the sidewall structure has an interior surface and an exterior surface, the interior surface defining an interior space; and
  a protective coating on at least a portion of the exterior surface of the sidewall structure, the protective coating comprising diamond-like carbon.

In yet a further aspect, for example, this disclosure provides a method for enhancing the mechanical strength of a polyethylene terephthalate (PET) container, the method comprising:
  providing a body structure having a top end that defines an opening, a sealed base end, and a sidewall structure extending between the top and base ends, wherein the sidewall structure has an interior surface and an exterior surface, the interior surface defining an interior space; and
  depositing a protective coating on at least a portion of the exterior surface of the sidewall structure, the protective coating comprising diamond-like carbon.

These and various other aspects and embodiments of this disclosure are illustrated in the drawings, examples, data, and detailed description that follow.

BRIEF DESCRIPTION OF THE DRAWINGS

New Bottle A (no DLC coating);
DLC-Coated Bottle (20 nm thick DLC coating); and
New Bottle B (no DLC coating).

DETAILED DESCRIPTION

Containers and associated methods disclosed herein include the combination of a body structure and a protective coating of diamond-like carbon (DLC) disposed thereon. The disclosed DLC coating surprisingly maintains the structural, and consequently the aesthetic, properties of the resulting containers for a greater period of time as compared to conventional containers without the protective coating. As a result, the present containers are capable of sustaining an increased number of bottle wash and refill cycles as compared to conventional containers.

Furthermore, it has now been unexpectedly discovered that employing a DLC coating as a protective coating on at least a portion of a glass container preserves the optical clarity of the glass containers by reducing, minimizing, or at the very least delaying the formation of surface flaws created by the reprocessing of the glass containers for purposes of reuse. This result is beneficial because sustaining optical clarity increases the reusability and life cycle of the glass containers, which in turn reduces manufacturing costs and waste. It has also been unexpectedly discovered that depositing the DLC coating via a high-energy process also provides a substantially clear coating, and consequently, a substantially colorless glass container.

Still further, it has also been unexpectedly discovered that a DLC coating imparts greater initial lubricity and maintains suitable lubricity for a longer period of time as compared to conventional containers. This effect is also beneficial because minimal friction among beverage bottles is desirable during processing, particularly during refilling operation. The disclosed containers and methods provide the ability to increase the mechanical strength of containers, without having undesirable effects on the overall initial optical clarity of the container material, and further to enhance the lubricity of the container surface, which in turn decreases the containers' susceptibility to scuffing.

Aspects of this disclosure provide for new containers and methods that enhance the mechanical strength of containers. This disclosure further provides for containers that include a DLC coating that increases the number of container wash and refill cycles while also decreasing certain adverse effects on the aesthetic properties of the containers.

In one aspect, the disclosure provides for a container comprising a body structure and a protective coating disposed on at least a portion of the body structure, in which the protective coating comprises diamond-like carbon (DLC).

Diamond-like carbon (DLC) is a metastable amorphous carbon material, but in some instances may include a microcrystalline phase. In some aspects, DLC films or coatings may be generally characterized as having high corrosion resistance, high wear resistance, and low friction coefficients in both dry and wet conditions. However, it was unexpectedly discovered that additional particularly desirable characteristics resulted when DLC coatings were applied to beverage bottles or containers, including certain benefits generally associated with both organic and inorganic materials. As a result, DLC coatings beneficially provided the ability to employ a long-lasting, effective protective coating for containers, particularly beverage containers.

Additionally, DLC films or coatings can be neutral transparent (i.e., having minimal to no visible light absorption or color hue), which provides further advantages for beverage container use. When combined with DLC's long-lasting, effective protective coating properties and due to the inert nature of DLC, DLC-coated bottles have the further advantage of being easily cleaned/sterilized, which again is particularly desirable for reusable beverage containers.

In some instances, the DLC protective coating has a thickness from about 0.01 µm to about 10 µm; alternatively from about 0.01 µm to about 0.02 µm; or alternatively from about 1 µm to 10 µm. According to another aspect, the protective coating can have a thickness of about 0.01 µm, 0.02 µm, 0.05 µm, 0.1 µm, 0.15 µm, 0.20 µm, 0.25 µm, 0.3 µm, 0.35 µm, 0.4 µm, 0.45 µm, 0.5 µm, 0.55 µm, 0.6 µm, 0.65 µm, 0.7 µm, 0.75 µm, 0.8 µm, 0.85 µm, 0.9 µm, 0.95 µm, 1 µm, 1.5 µm, 2 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, or 10 µm. The protective coating also can have a thickness range between any of these recited thicknesses.

In certain aspects, the DLC-coated containers according to this disclosure can exhibit substantially lower coefficients of friction as compared to uncoated containers or containers that are coated with conventional coatings such as $SnO_2$. For example, the DLC-coated bottles according to this disclosure can have a coefficient of friction that is up to or about 0.25; alternatively, of about 0.01 to about 0.25; or alternatively, of 0.05 to about 0.2. According to another aspect, the present DLC-coated containers can have a coefficient of friction of about 0.001, 0.005, 0.01, 0.02, 0.03, 0.04, 0.05, 0.06, 0.07, 0.08, 0.09, 0.1, 0.11, 0.12, 0.13, 0.14, 0.15, 0.16, 0.17, 0.18, 0.19, 0.2, 0.21, 0.22, 0.23, 0.24, or 0.25. The DLC-coated containers of this disclosure can also can have a coefficient of friction range between any of these recited coefficients of friction.

In further aspects, the present DLC-coated containers can have, after about 30 caustic washes, a coefficient of friction that is up to or about 0.25. Alternatively, after about 30 caustic washes, the present DLC-coated containers may have a coefficient of friction of about 0.24 or less, 0.23 or less, 0.22 or less, 0.21 or less, 0.2 or less, 0.19 or less, 0.18 or less, 0.17 or less, 0.16 or less, 0.15 or less, 0.14 or less, 0.13 or less, 0.12 or less, 0.11 or less, 0.1 or less, 0.09 or less, 0.08 or less, 0.07 or less, 0.06 or less, 0.05 or less, 0.04 or less, 0.03, 0.02 or less, 0.01 or less, or 0.005 or less. These DLC-coated containers also can have a coefficient of friction range between any of these recited coefficients of friction.

As used herein, a "caustic wash" is generally defined as a high temperature aqueous base washing process, which is typically used for sterilization of containers for reuse. During each refilling cycle of a reusable container, the container undergoes a caustic wash. In one instance, a caustic wash includes immersing and/or flushing the interior/exterior surfaces of used containers with 2.25% NaOH water solution at 75° C. for about 5 to 7 minutes, and then rinsing the containers with clean water. The caustic washing used in each refilling cycle commonly etches and damages conventional containers (i.e., containers without the DLC protective coating). Reusable beverage containers often can be reused for up to about 20 refilling cycles for PET containers or 30 refilling cycles for glass containers, before structural and/or aesthetic degradation necessitates removing the container from circulation. Surprisingly, it has been discovered that by employing a DLC protective coating on the exterior surface of the present containers, the mechanical strength of the containers is substantially increased, thereby being more resistant to high temperature caustic washing, and consequently, increasing the container life cycle.

Figure 1A:
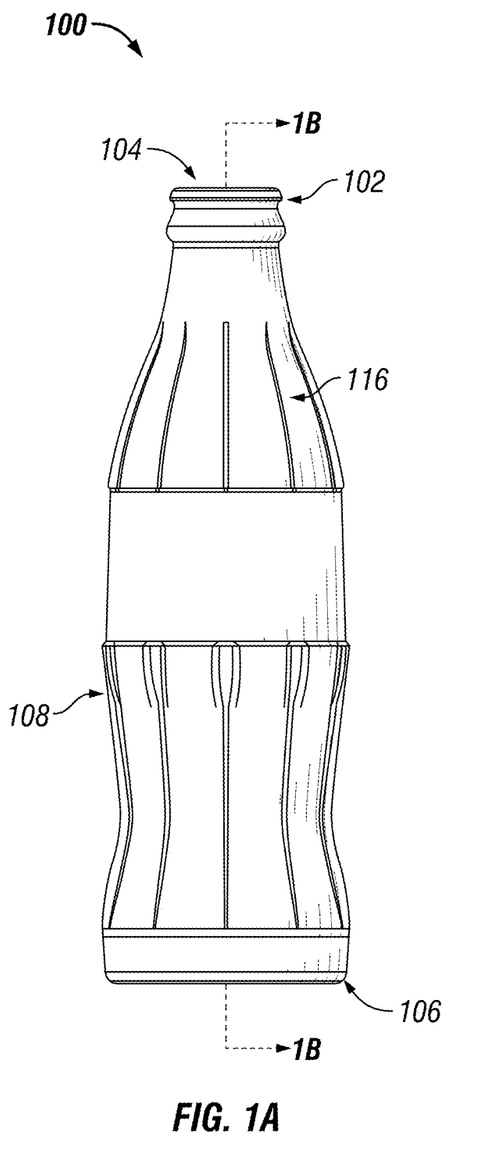
FIG. 1A is a side elevation view of one embodiment of a container in accordance with the present disclosure.
Figure 1B:
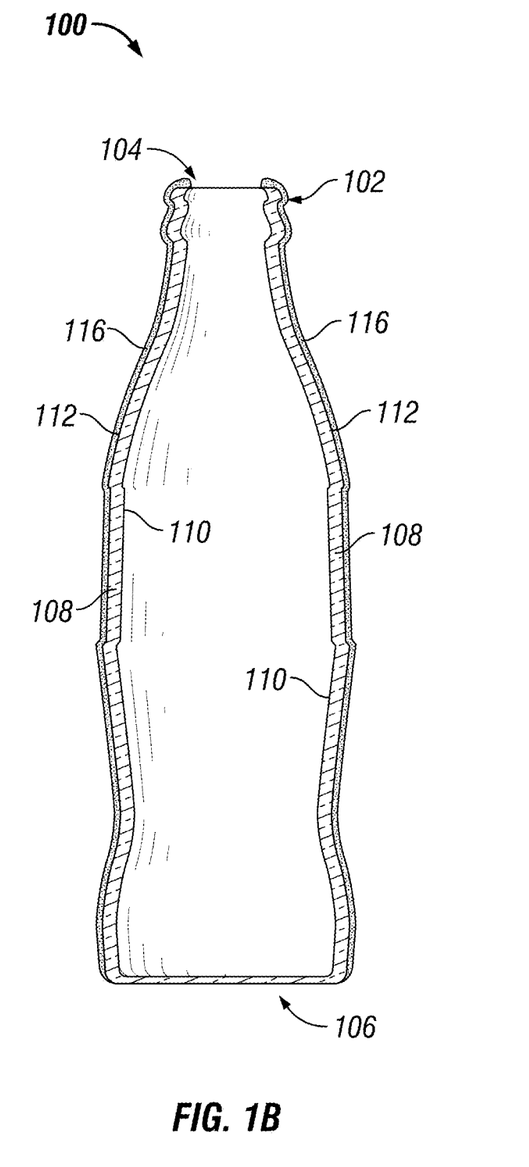
FIG. 1B is a cross-sectional view of the container in FIG. 1A taken at line B-B.

One embodiment of a container is shown in FIGS. 1A and 1B. The container 100 includes a top end 102 that defines an opening 104, a sealed base end 106, and a sidewall structure 108 extending between the top and base ends 102, 106. The sidewall structure 108 has an interior surface 110 and an exterior surface 112, in which the interior surface 110 defines an interior space 114. The container 100 further includes a protective coating 116 on at least a portion of the exterior surface 112 of the sidewall structure 108.

In certain instances, the protective coating may also be disposed on at least a portion of the top end of the container 102, on at least a portion of the base end of the container 106, or both. Examples of such containers, which are shown in the cross-section, are illustrated in FIGS. 2 and 3.

Figure 2:
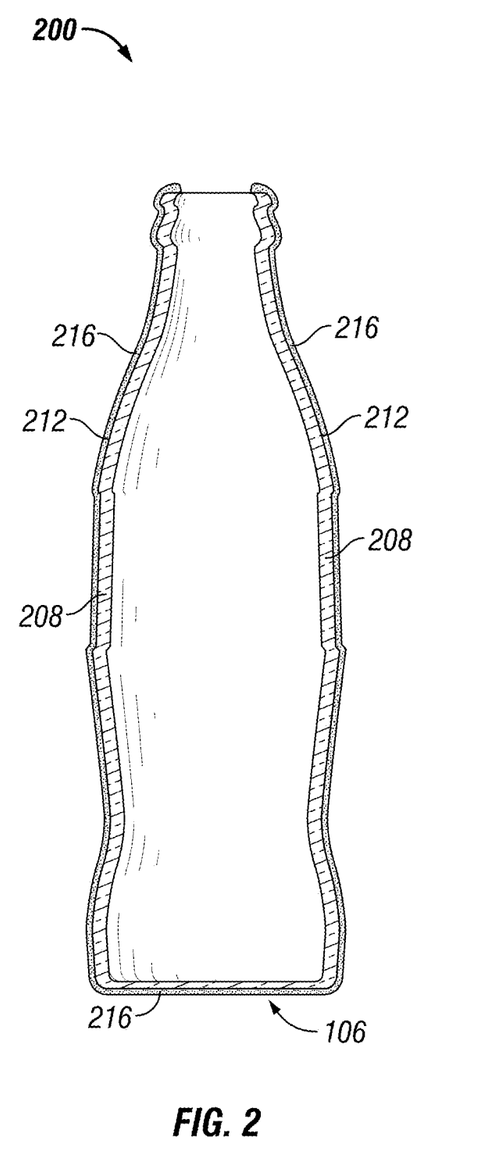
FIG. 2 is a cross-sectional view of another embodiment of a container in accordance with the present disclosure.
Figure 3:
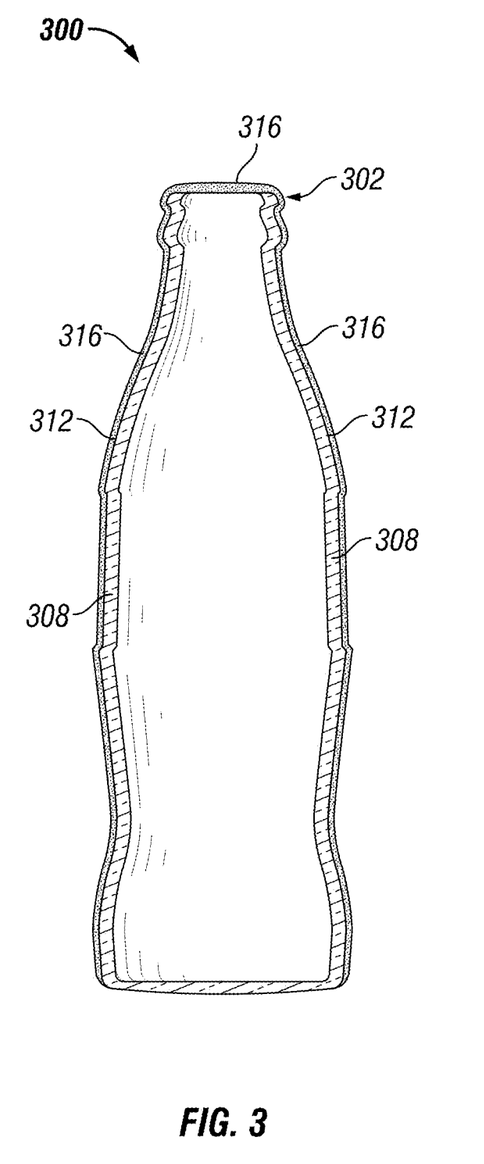
FIG. 3 is a cross-sectional view of still another embodiment of a container in accordance with the present disclosure.

In FIG. 2, the container 200 includes a protective coating 216 disposed on at least a portion of the exterior surface 212 of the sidewall structure 208 and the sealed base end 206. In FIG. 3, the container 300 includes a protective coating 316 disposed on at least a portion of the exterior surface 312 of the sidewall structure 308 and the top end 302.

In some instances, the container is a glass container, whereas in other instances, the container is a polyester container, such as a polyethylene terephthalate (PET) container. In one aspect, the container comprises a body structure that comprises glass and polyethylene terephthalate (PET).

In certain aspects, the protective coating is applied onto at least a portion of the body structure using a high energy deposition process. In one aspect, the high energy deposition process can be ion beam deposition. Hydrocarbon gases, such as $CH_4$, $C_2H_6$, $C_2H_4$, and $C_2H_2$, may be used as precursors in this type of deposition process. These precursor gases may also be diluted with, for example, $H_2$ and/or Ar, during the deposition process.

As used herein, "high-energy" is defined as energy in the amount of about 25 eV or greater. In an aspect, the amount of energy is from about 50 eV to about 500 eV. In other instances, the amount of energy is about 50 eV, 55 eV, 60 eV, 65 eV, 70 eV, 75 eV, 80 eV, 85 eV, 90 eV, 95 eV, 100 eV, 105 eV, 110 eV, 115, eV, 120 eV, 125 eV, 130 eV, 135 eV, 140 eV, 145 eV, 150 eV, 155 eV, 160 eV, 165 eV, 170 eV, 175 eV, 180 eV, 185 eV, 190 eV, 195 eV, 200 eV, 205 eV, 210 eV, 215, eV, 220 eV, 225 eV, 230 eV, 235 eV, 240 eV, 245 eV, 250 eV, 255 eV, 260 eV, 265 eV, 270 eV, 275 eV, 280 eV, 285 eV, 290 eV, 295 eV, 300 eV, 305 eV, 310 eV, 315, eV, 320 eV, 325 eV, 330 eV, 335 eV, 340 eV, 345 eV, 350 eV, 355 eV, 360 eV, 365 eV, 370 eV, 375 eV, 380 eV, 385 eV, 390 eV, 395 eV, 400 eV, 405 eV, 410 eV, 415, eV, 420 eV, 425 eV, 430 eV, 435 eV, 440 eV, 445 eV, 450 eV, 455 eV, 460 eV, 465 eV, 470 eV, 475 eV, 480 eV, 485 eV, 490 eV, 495 eV, or 500 eV. The energy also may be in an amount that is in a range between any of the recited energy values.

In some aspects, the protective coating is directly deposited onto at least a portion of the body structure of the container. In such embodiments, no other coating is disposed between the protective coating and the body structure.

In other aspects, the protective coating is indirectly deposited onto at least a portion of the body structure of the container. In such instances, one or more other coatings are deposited or otherwise disposed between the protective coating and the body structure. In one instance, one or more other coatings, such as a $SnO_2$ hot end coating or a stearate cold end coating, may be disposed onto the body structure prior to depositing the protective coating, such that the one or more other coatings are located between the body structure and protective coating of the resulting container.

In certain aspects, the present containers may be substantially clear. For example, in one instance, a glass container having the protective coating may be substantially clear.

As used herein, "substantially clear" when used to describe a glass bottle is defined as a glass bottle having a purity of up to 6% and a brightness of 65% or greater. The purity and brightness are each measured at a dominant wavelength between 500-573 nm, calibrated at a 38 mm glass thickness equivalent.

The purity (the excitation purity) of a stimulus is the difference from the illuminant's white point to the furthest point on the chromaticity diagram with the same hue (dominant wavelength for monochromatic sources). As used herein, "purity", according to the CIE 1931 color space, is defined by the following formula:

$$p_e = \sqrt{\frac{(x - x_n)^2 + (y - y_n)^2}{(x_I - x_n)^2 + (y_I - y_n)^2}}$$

wherein:
X, Y is the chromaticity of the stimulus;
$X_n$, $Y_n$ is the chromaticity of the white point; and
$X_I$, $Y_I$ is the point on the perimeter whose line segment to the white point contains the chromaticity of the stimulus.

Also as used herein, "brightness" is the light transmission equivalent through 38 mm glass thickness.

In some aspects, the protective coating may also include one or more dopants. Non-limiting examples of suitable dopants include hydrogen, oxygen, nitrogen, fluorine, boron, silicon, metals, and combinations thereof.

Without being bound to a single theory, by employing one or more dopants within the protective coating, it is thought that any remaining optically-absorbing $sp^2$ bonds may effectively be optically "neutralized" so that absorption peaks do not encroach into the visible spectrum. This effect helps to achieve a substantially clear protective coating, and consequently a substantially clear container (for example, a substantially clear glass container). It should be noted, however, that such dopants may affect the mechanical strength of the resulting container. For example, in some instances, these dopants may alter and even reduce the coefficient of friction of the container's surface in certain service conditions, whereas in other instances, alter or reduce the overall hardness of the protective coating.

Susceptibility to scuffing and scratching during filling processes is also a factor in container design and configuration, particularly refillable containers. Scuffing damage is often caused by caustic wash cycles and mechanical contact friction, both of which typically occur during sanitizing and refilling procedures using refillable containers. For example, in order to make scuffing less visible or obstructive on the container surface, conventional refillable containers may be designed with contact rings on the exterior surfaces, which extend about the circumference of the containers. These contact rings may be continuous with the outer surface of the bottle. For example, on an irregularly-shaped bottle, the contact ring may be the widest portion of the bottle, where bottles being passed through typical bottling machinery will contact one another. In these embodiments, the contact ring may be a portion of the outer surface of the bottle which extends along the entire outer circumference of the bottle. Scuffing, if any, may be limited to these contact rings. The extent of scuffing may be measured or quantified by what portion of the contact ring is scuffed. As used herein, "scuff height" is a distance to which scuffing can be visually perceived to extend across the height of a contact ring. That is, the scuff height extends in a direction that is perpendicular to the circumference of the container. Scuff height may increase with each bottle refilling process cycle. Surprisingly, it has been discovered that, under the same filling process conditions, containers comprising a DLC coating according to aspects of the present disclosure may display less scuffing than comparative containers without the protective coating.

In some aspects, a container having the protective DLC coating, after undergoing a filling or refilling process, can have less scuffing than a comparative container (a standard or control) that does not have the protective DLC coating when measured under the same conditions. For example, in certain instances, a glass or PET container having the DLC protective coating, after undergoing a filling or refilling cycle, has a scuff height that is less than the scuff height of a comparative glass or PET container that does not have the protective coating.

As used herein, a "filling process" is a process in which the beverage containers are sorted, cleaned, inspected, filled with a beverage product, re-inspected, packed, and then shipped.

As used herein, a "comparative container" (glass or PET) is a control container which is substantially the same in composition and structure as a test container, except that the comparative control container does not include the DLC protective coating of the test container. In some instances, a comparative (control) container may include organic coatings which are not present on the test container. The comparative (control) container and the test container (including the DLC protective coating) are usually derived from the same base body structure material (for example, glass and/or PET) and designed with the same body structure. The DLC protective coating is then deposited onto at least a portion of the body structure of the test container, whereas no DLC protective coating at all is deposited onto the body structure of the comparative (control) container. In some aspects, the comparative container may include a protective coating deposited onto the body structure of the comparative container, so long as the protective coating is not a DLC protective coating.

As used herein, the term "comparative scuff ring height" means the scuff height of a "comparative container" that is measured under the same conditions and parameters as the measured scuff ring height of the test container including a DLC protective coating in accordance with the present disclosure.

EXAMPLES

Three sets of glass bottles were prepared and analyzed in the following examples:

New Bottles: These bottles were glass bottles having $SnO_2$ hot end coating (HEC) and organic stearate cold end coating (CEC) deposited thereon. These bottles, unlike the Scuffed Bottles, were not filled with product and introduced into the market.

Scuffed Bottles: These bottles were initially new bottles as described above, but then filled/refilled and used/reused in the market. These bottles underwent 4 refilling cycles.

DLC-Coated Bottles: These bottles were initially new bottles as described above. Then the organic stearate CEC was removed from the bottles using solvent, such as Acetone, and then further plasma cleaned by ion beam sputtering to produce cleansed bottles. Each cleansed bottle was then coated with a DLC coating using an ion deposition process, which was performed by by Genvac Aerospace Inc. The resulting DLC-Coated bottles had a DLC coating thickness of 20 nm. These bottles, like the New Bottles, were not filled with product and were not introduced into the marketplace.

Example 1: Lubricity Analysis

Internal tilt angle tests were performed on New Bottles, Scuffed Bottles, And DLC-Coated Bottles to measure the coefficient of friction between the bottles. The procedure for each test was conducted as follows: (1) Three bottles were placed horizontally on a tilt table in a pyramidal configuration, with two bottles alongside each other on the bottom, and the third bottle on top of the two lower bottles; (2) the test began by slowly increasing the angle of inclination of the tilt table, at a rate of 3.6 degrees per second; (3) the test was stopped when the top bottle slipped from its resting state atop the lower two bottles; (4) the angle at which the top bottle slipped was read and recorded from the dial on the tester; and (5) the bottle on the top was rotated horizontally by 90° and steps (1) through (4) were repeated.

The specific tilt angle tests conducted were as follows:

| Test Number | Top Bottle  | Bottom Bottles |
|-------------|-------------|----------------|
| 1           | Scuffed     | Scuffed        |
| 2           | New         | New            |
| 3           | DLC-Coated  | New            |
| 4           | DLC-Coated  | DLC-Coated     |

Figure 4:
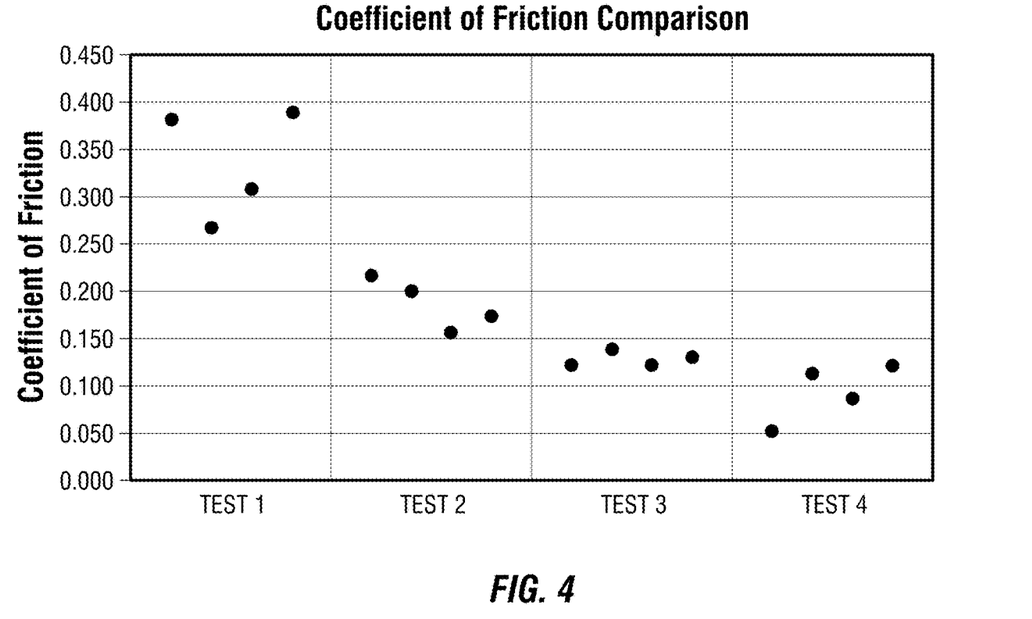
FIG. 4 graphically illustrates the test results from the comparative coefficient friction analysis in Example 1.

Table 1 below summarizes the results of the each tilt angle test, which are also graphically represented in FIG. 4. The higher angles correspond to higher friction, while the lower angles corresponding to lower friction (higher lubricity) between the top and bottom bottles:

TABLE 1

Measured Tilt Angle and Coefficient of Friction

| Test Number | Rotation Angle | Angle in Degrees | Coefficient of Friction |
|---|---|---|---|
| 1 | −0 | 22.5 | 0.383 |
|  | −90 | 15.5 | 0.267 |
|  | −180 | 18.0 | 0.309 |
|  | −270 | 23.0 | 0.391 |
| 2 | −0 | 12.5 | 0.216 |
|  | −90 | 11.5 | 0.199 |
|  | −180 | 9.0 | 0.156 |
|  | −270 | 10.0 | 0.174 |
| 3 | −0 | 7.0 | 0.122 |
|  | −90 | 8.0 | 0.139 |
|  | −180 | 7.0 | 0.122 |
|  | −270 | 7.5 | 0.131 |
| 4 | −0 | 3.0 | 0.052 |
|  | −90 | 6.5 | 0.113 |
|  | −180 | 5.0 | 0.087 |
|  | −270 | 7.0 | 0.122 |

The results of Table 1 indicate that the DLC-Coated bottles had the lowest tilt angle as compared to the New and Scuffed bottles. Specifically, the DLC-Coated Bottles had tilt angles as low as 3°. The tilt angles of the DLC-Coated Bottles were significantly less than the New Bottles, which had tilt angles of 9~12.5°, and than the Scuffed Bottles, which had tilt angles of 15.5~22.5°. As indicated by the low measured tilt angle, the DLC-Coated Bottles had the lowest coefficient friction, and therefore the greatest lubricity. It should be noted that the non-uniformity among the foregoing results for the coefficient of friction of the DLC-Coated Bottles is believed to be due to the fact that only one side of these bottles was actually coated with DLC. Specifically, while not intending to be bound by theory, it is believed that only the side that faced the ion beam source of the deposition equipment was coated with DLC.

A low coefficient of friction, or high lubricity, between glass bottles is desirable to maintain a smooth filing line operation without excessive pressure and breakage. It can be seen from the results of Table 1 that employing DLC as a protective coating is surprisingly effective in decreasing the coefficient of friction and sustaining a low coefficient of friction.

Although conventional new glass bottles are typically sprayed with a cold end coating (CEC) near the end of bottle production to improve lubricity among the bottles, the CEC can typically be washed off during the caustic washing process. The CEC applied to conventional new glass bottles therefore becomes ineffective after about one use. Because the Scuffed Bottles underwent caustic washing and refilling processes, and because scuffing occurs during the refilling process, it is not surprising that the scuffed on scuffed (Test 1) results reflect high coefficients of friction. While not intending to be bound by theory, it is believed that, during the caustic washing and refilling processes experienced by the Scuffed Bottles, the original CEC coating was rendered ineffective.

Example 2: Effect of Caustic Washing on Lubricity

One DLC-Coated Bottle and three New Bottles each underwent an internal caustic wash test and analysis, in which each bottle was washed with a 2.25 wt % NaOH aqueous solution at 75° C. for 3 hours, which is equivalent to about 36 washing cycles. After this caustic wash test, a tilt angle test was performed on each test sample.

The tilt angle tests were as follows:

| Test Number | Top Bottle | Bottom Bottles |
|---|---|---|
| 5 | New (caustic washed) | New (caustic washed) |
| 6 | DLC-Coated (caustic washed) | New (caustic washed) |
| 7 | New (caustic washed) | New |
| 8 | DLC-Coated (caustic washed) | New |

Figure 5:
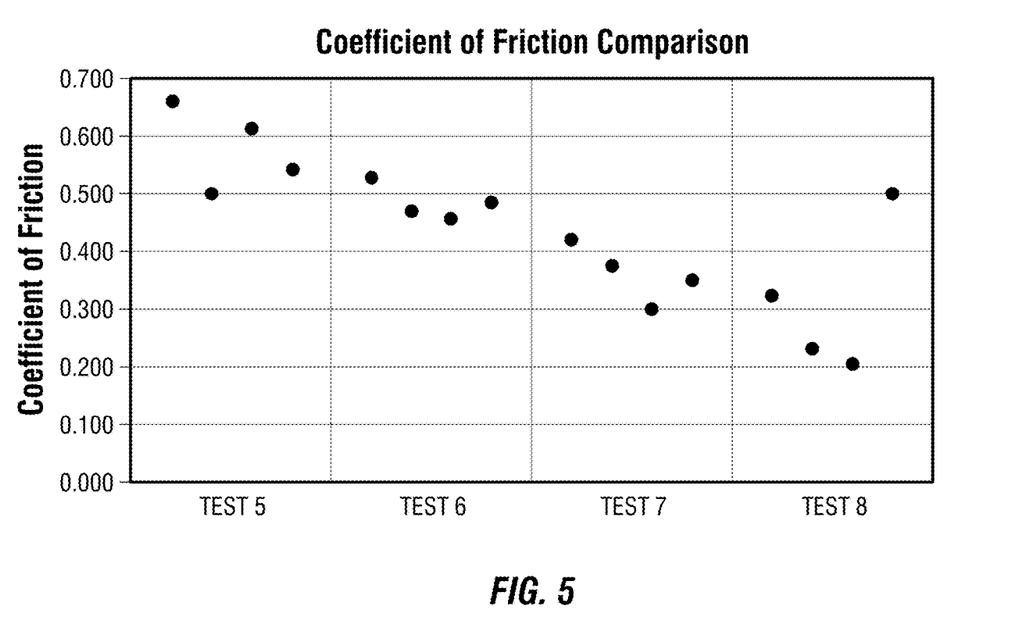
FIG. 5 graphically illustrates the test results from the comparative coefficient friction analysis in Example 2.

Table 2 below summarizes the results of the each tilt angle test, which are also graphically represented in FIG. 5. The higher tilt angles correspond to higher coefficients of friction, while the lower angles corresponding to lower coefficients of friction (higher lubricity):

TABLE 2

Measured Tilt Angle and Coefficient of Friction

| Test Number | Rotation Angle | Angle in Degrees | Coefficient of Friction |
|---|---|---|---|
| 5 | −0 | 41.5 | 0.663 |
|  | −90 | 30.0 | 0.500 |
|  | −180 | 38.0 | 0.616 |
|  | −270 | 33.0 | 0.545 |
| 6 | −0 | 32.0 | 0.530 |
|  | −90 | 28.0 | 0.469 |
|  | −180 | 27.0 | 0.454 |
|  | −270 | 29.0 | 0.485 |
| 7 | −0 | 25.0 | 0.423 |
|  | −90 | 22.0 | 0.375 |
|  | −180 | 17.5 | 0.301 |
|  | −270 | 20.5 | 0.350 |
| 8 | −0 | 19.0 | 0.326 |
|  | −90 | 13.5 | 0.233 |
|  | −180 | 12.0 | 0.208 |
|  | −270 | 30.0 | 0.500 |

The results of Table 2 indicate that the DLC-Coated caustic washed bottles had lower tilt angles for each rotational angle than the New (caustic washed) bottles. This indicates that, after the caustic washing, at least a portion of the DLC coating remained on the glass bottle surface. In contrast, the tilt angle results drastically increased for the New (caustic washed) bottles compared to the New Bottles, indicating the CEC, and likely the underlying hot end coating (HEC), were etched away from the New Bottles by the caustic washing. Moreover, none of the New (caustic washed) bottles had a tilt angle of less than 15°.

Again, for at least the reasons stated above, it is desirable for there to be minimal friction (high lubricity) between the glass bottles during refilling production. It can be seen from the results of Table 2 that employing DLC as a protective coating is surprisingly effective in not only initially decreasing friction, but also sustaining this decrease in friction after a number of refilling cycles.

Example 3: Effect of the Filling Process

An internal line simulator test was conducted, using an Agr Line Simulator, to simulate the scuffing creation during the refilling process of glass containers. One DLC-Coated Bottle and 3 New Bottles, all went through the 3-hour caustic test, and 24 Scuffed Bottles returned from market (as balance) were tested for a total duration of 3 hours.

The test was conducted as follows: the Arg Line Simulator carried containers on a circular aluminum drive plate covered with a non-metallic disk. A motor drove the disk at a speed of 20 rpm. This speed simulated a container speed of approximately 500 containers per minute using 12 ounce capacity containers, with 28 containers in testing. The containers were guided in a circular path by two pairs of non-abrasive plastic rails. A rubber-covered gate, activated by an adjustable spring, interrupted the flow of containers through the channel. This created line pressure, resulting in approximately 20% slippage of the containers on the cover disk. The equivalent linear speed of the containers was about 400 containers per minute (12 ounce capacity container). The containers rotated against each other as they passed through the gate and received an impact as they caught up to the line. At a point just ahead of the gate, water from an adjustable spray head was automatically turned on by an electric valve during the test. The duration of the test was controlled by an automatic reset timer, or switching on/off manually.

Figure 6:
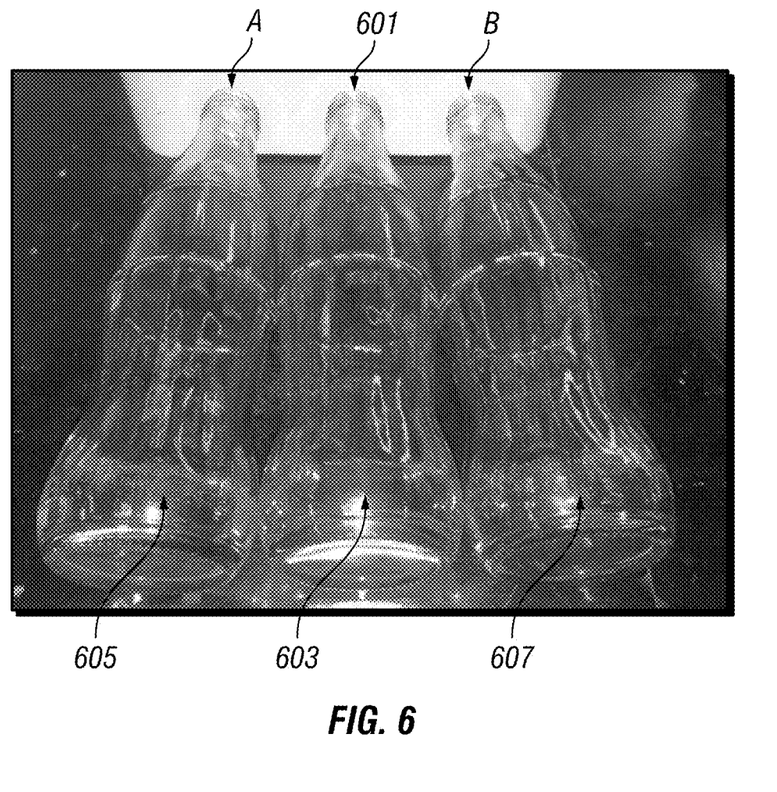
FIG. 6 provides photographs of various glass containers that were analyzed for scuffing in Example 3. In order (from left to right) are.
Figure 7A:
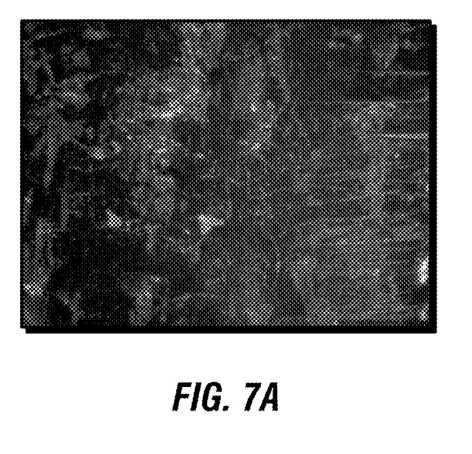
FIG. 7A is an optical microscope image (enlarged about 100×) of a portion of the exterior surface of the New Bottle A in FIG. 6.
Figure 7B:
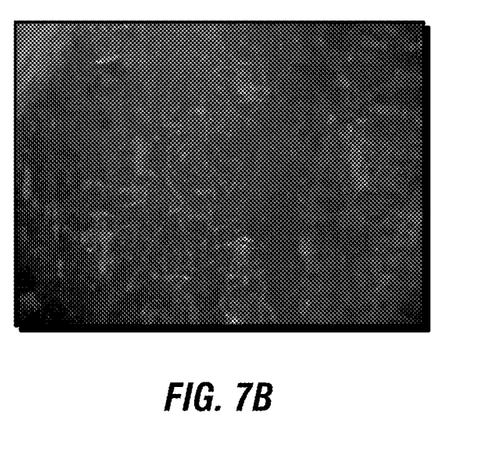
FIG. 7B is an optical microscope image (enlarged about 100×) of a portion of the exterior surface of DLC-Coated Bottle in FIG. 6.

FIGS. 6, 7A and 7B visually illustrate the scuffing development comparison between two of the three New Bottles, i.e., New Bottle A and New Bottle B, and the DLC-Coated Bottle 601 after caustic test and the line simulator test. Specifically, as can be seen in FIG. 6, there was relatively less scuffing in the heel contact area 603 of the DLC-Coated Bottle 601 than the heel contact areas 605, 607 in each of 601 of the two New Bottles A, B. That is, the DLC-Coated Bottle 601 has a scuff height at the heel contact ring that is less than the scuff height at the heel contact ring of each New Bottle A, B.

The disclosures of various publications may be referenced throughout this specification, which are hereby incorporated by reference in pertinent part in order to more fully describe the state of the art to which the disclosed subject matter pertains. To the extent that any definition or usage provided by any document incorporated herein by reference conflicts with the definition or usage provided herein, the definition or usage provided herein controls.

Throughout the specification and claims, the word "comprise" and variations of the word, such as "comprising" and "comprises," means "including but not limited to," and is not intended to exclude, for example, other additives, components, elements, or steps. While methods and features are described in terms of "comprising" various steps or components, these methods and features can also "consist essentially of" or "consist of" the various steps or components.

Unless indicated otherwise, when a range of any type is disclosed or claimed, for example a range of percentage, thickness, coefficient of friction, and the like, it is intended to disclose or claim individually each possible number that such a range could reasonably encompass, including any sub-ranges or combinations of sub-ranges encompassed therein. When describing a range of measurements such as these, every possible number that such a range could reasonably encompass can, for example, refer to values within the range with one significant figure more than is present in the end points of a range, or refer to values within the range with the same number of significant figures as the end point with the most significant figures, as the context indicates or permits. For example, when describing a range of percentages such as from 85% to 95%, it is understood that this disclosure is intended to encompass each of 85%, 86%, 87%, 88%, 89%, 90%, 91%, 92%, 93%, 94%, and 95%, as well as any ranges, sub-ranges, and combinations of sub-ranges encompassed therein. Applicants' intent is that these two methods of describing the range are interchangeable. Accordingly, Applicants reserve the right to proviso out or exclude any individual members of any such group, including any sub-ranges or combinations of sub-ranges within the group, if for any reason Applicants choose to claim less than the full measure of the disclosure, for example, to account for a reference that Applicants are unaware of at the time of the filing of the application.

Values or ranges may be expressed herein as "about", from "about" one particular value, and/or to "about" another particular value. When such values or ranges are expressed, other embodiments disclosed include the specific value recited, from the one particular value, and/or to the other particular value. Similarly, when values are expressed as approximations, by use of the antecedent "about," it will be understood that the particular value forms another embodiment. It will be further understood that there are a number of values disclosed herein, and that each value is also herein disclosed as "about" that particular value in addition to the value itself. In aspects, "about" can be used to mean within 10% of the recited value, within 5% of the recited value, or within 2% of the recited value.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

In any application before the United States Patent and Trademark Office, the Abstract of this application is provided for the purpose of satisfying the requirements of 37 C.F.R. § 1.72 and the purpose stated in 37 C.F.R. § 1.72(b) "to enable the United States Patent and Trademark Office and the public generally to determine quickly from a cursory inspection the nature and gist of the technical disclosure." Therefore, the Abstract of this application is not intended to be used to construe the scope of the claims or to limit the scope of the subject matter that is disclosed herein. Moreover, any headings that are employed herein are also not intended to be used to construe the scope of the claims or to limit the scope of the subject matter that is disclosed herein. Any use of the past tense to describe an example otherwise indicated as constructive or prophetic is not intended to reflect that the constructive or prophetic example has actually been carried out.

Those skilled in the art will readily appreciate that many modifications are possible in the exemplary embodiments disclosed herein without materially departing from the novel teachings and advantages according to this disclosure. Accordingly, all such modifications and equivalents are intended to be included within the scope of this disclosure as defined in the following claims. Therefore, it is to be understood that resort can be had to various other aspects, embodiments, modifications, and equivalents thereof which, after reading the description herein, may suggest themselves to one of ordinary skill in the art without departing from the spirit of the present disclosure or the scope of the appended claims.

Applicants reserve the right to proviso out any selection, feature, range, element, or aspect, for example, to limit the scope of any claim to account for a prior disclosure of which Applicants may be unaware.

Embodiments

The following numbered embodiments, aspects, and features of the disclosure are provided, with an emphasis on the ability to combine the various features which may disclosed only in certain embodiments, into other disclosed embodiments, as the context and technical reason allow.

1. A glass container comprising:
a body structure having a top end that defines an opening, a sealed base end, and a sidewall structure extending between the top and base ends, wherein the sidewall structure has an interior surface and an exterior surface, the interior surface defining an interior space; and
a protective coating on at least a portion of the exterior surface of the sidewall structure, the protective coating comprising diamond-like carbon,
wherein the glass container is substantially clear.

2. The glass container according to embodiment 1, wherein the protective coating is applied on the at least a portion of the exterior surface via a high-energy deposition process.

3. The glass container according to any of embodiments 1 and 2, wherein the protective coating is on at least a portion of the top end, at least a portion of the base end, or both.

4. The glass container according to any preceding embodiment, wherein the protective coating further comprises one or more dopants.

5. The glass container according to any preceding embodiment, wherein the glass container has a coefficient of friction that is up to or about 0.25.

6. The glass container according to any of embodiments 1-4, wherein, after about 30 caustic washes, the glass container has a coefficient of friction that is up to or about 0.25.

7. The glass container according to any preceding embodiment, wherein the glass container has less scuffing than a comparative glass container without the protective coating.

8. The glass container according to any preceding embodiment, wherein the protective coating has a thickness from about 0.01 µm to about 10 µm.

9. A method for enhancing the mechanical strength of a glass container, the method comprising:
providing a body structure having a top end that defines an opening, a sealed base end, and a sidewall structure extending between the top and base ends, wherein the sidewall structure has an interior surface and an exterior surface, the interior surface defining an interior space; and
depositing a protective coating on at least a portion of the exterior surface of the sidewall structure, the protective coating comprising diamond-like carbon,
wherein the glass container is substantially clear.

10. The method according to embodiment 9, wherein the protective coating is applied on the at least a portion of the exterior surface via a high-energy deposition process.

11. The method according to embodiment 9 and 10, wherein the protective coating is on at least a portion of the top end, at least a portion of the base end, or both.

12. The method according to embodiments 9-11, wherein the protective coating further comprises one or more dopants.

13. The method according to embodiments 9-11, wherein the glass container has a coefficient of friction that is up to or about 0.25.

14. The method according to embodiments 9-11, wherein, after about 30 caustic washes, the glass container has a coefficient of friction that is up to or about 0.25.

15. The method according to embodiments 9-14, wherein the glass container has less scuffing than a comparative glass container without the protective coating.

16. The method according to embodiments 9-15, wherein the protective coating has a thickness from about 0.01 µm to about 10 µm.

17. A polyethylene terephthalate (PET) container comprising:
a body structure having a top end that defines an opening, a sealed base end, and a sidewall structure extending between the top and base ends, wherein the sidewall structure has an interior surface and an exterior surface, the interior surface defining an interior space; and
a protective coating on at least a portion of the exterior surface of the sidewall structure, the protective coating comprising diamond-like carbon.

18. The PET container according to embodiment 17, wherein the protective coating is applied on the at least a portion of the exterior surface via a high-energy deposition process.

19. The PET container according to any of embodiments 17 and 18, wherein the protective coating is on at least a portion of the top end, at least a portion of the base end, or both.

20. The PET container according to any of embodiments 17-19, wherein the protective coating further comprises one or more dopants.

21. The PET container according to any of embodiments 17-20, wherein the PET container has a coefficient of friction that is up to or about 0.25.

22 The PET container according to any of embodiments 17-21, wherein the PET container has less scuffing than a comparative PET container without the protective coating.

23. The PET container according to any of embodiments 17-22, wherein the protective coating has a thickness from about 0.01 µm to about 10 µm.

24. A method for enhancing the mechanical strength of a polyethylene terephthalate (PET) container, the method comprising:
providing a body structure having a top end that defines an opening, a sealed base end, and a sidewall structure extending between the top and base ends, wherein the sidewall structure has an interior surface and an exterior surface, the interior surface defining an interior space; and
depositing a protective coating on at least a portion of the exterior surface of the sidewall structure, the protective coating comprising diamond-like carbon.

25. The method according to embodiment 24, wherein the protective coating is applied on the at least a portion of the exterior surface via a high-energy deposition process.

26. The method according to any of embodiments 24 and 25, wherein the protective coating is on at least a portion of the top end, at least a portion of the base end, or both.

27. The method according to any of embodiments 24-26, wherein the protective coating further comprises dopants.

28. The method according to any of embodiments 24-27, wherein the PET container has a coefficient of friction that is up to or about 0.25.

29. The method according to any of embodiments 24-28, wherein the PET container has less scuffing than a comparative PET container without the protective coating.

30. The method according to any of embodiments 24-29, wherein the protective coating has a thickness from about 0.01 μm to about 10 μm.

What is claimed is:

1. A method for enhancing the mechanical strength of a glass carbonated beverage container, the method comprising:
   providing a body structure having a top end that defines an opening, a sealed base end, and a sidewall structure extending between the top and base ends, wherein the sidewall structure has an interior surface and an exterior surface, the interior surface defining an interior space; and
   depositing a protective coating on at least a portion of the exterior surface of the sidewall structure, the protective coating comprising a $SnO_2$ hot end coating layer, which is coated with diamond-like carbon (DLC) layer, wherein the DLC layer has a thickness from about 0.01 μm to about 0.05 μm;
   wherein the protective coating is applied via a high-energy deposition process utilizing an energy value of 25 eV or greater; and
   wherein the glass carbonated beverage container is substantially clear.

2. The method of claim 1, wherein the high-energy deposition process utilizes an energy value in the range of 50 eV to 500 eV.

3. The method of claim 1, wherein the protective coating is on at least a portion of the top end, at least a portion of the base end, or both.

4. The method of claim 1, wherein the protective coating further comprises one or more dopants.

5. The method of claim 1, wherein the glass carbonated beverage container has a coefficient of friction that is up to or about 0.25.

6. The method of claim 1, wherein, after about 30 caustic washes, the glass carbonated beverage container has a coefficient of friction that is up to or about 0.25.

7. The method of claim 1, wherein the glass carbonated beverage container has less scuffing than a comparative glass carbonated beverage container without the protective coating.

8. The glass carbonated beverage container of claim 1, wherein the protective coating has a thickness from about 0.01 μm to about 0.02 μm.

9. A method for enhancing the mechanical strength of a polyethylene terephthalate (PET) carbonated beverage container, the method comprising:
   providing a body structure having a top end that defines an opening, a sealed base end, and a sidewall structure extending between the top and base ends, wherein the sidewall structure has an interior surface and an exterior surface, the interior surface defining an interior space; and
   depositing a protective coating on at least a portion of the exterior surface of the sidewall structure, the protective coating comprising a stearate cold end coating layer, which is coated with diamond-like carbon (DLC) layer, wherein the DLC layer has a thickness from about 0.01 μm to about 0.05 μm; and
   wherein the protective coating is deposited via a high-energy deposition process utilizing an energy value of 25 eV or greater.

10. The method of claim 9, wherein the high-energy deposition process utilizes an energy value in the range of 50 eV to 500 eV.

11. The method of claim 9 or 10, wherein the protective coating is on at least a portion of the top end, at least a portion of the base end, or both.

12. The method of claim 9, wherein the protective coating further comprises dopants.

13. The method of claim 9, wherein the PET carbonated beverage container has a coefficient of friction that is up to or about 0.25.

14. The method of claim 9, wherein the PET carbonated beverage container has less scuffing than a comparative PET carbonated beverage container without the protective coating.

15. The method of claim 9, wherein the protective coating has a thickness from about 0.01 μm to about 0.02 μm.

* * * * *